(12) United States Patent  (10) Patent No.: US 8,854,072 B2
Dau et al.  (45) Date of Patent: Oct. 7, 2014

(54) HIGH TEMPERATURE-LOW LEAKAGE PROBE APPARATUS AND METHOD OF MANUFACTURING SAME

(76) Inventors: Hai Dau, San Ramon, CA (US);
Rupinder S. Mand, San Jose, CA (US);
Jaspreet Singh, San Jose, CA (US);
John Williamson, Menlo Park, CA (US)

( * ) Notice: Subject to any disclaimer, the term of this patent is extended or adjusted under 35 U.S.C. 154(b) by 455 days.

(21) Appl. No.: 13/153,163

(22) Filed: Jun. 3, 2011

(65) Prior Publication Data

US 2012/0306524 A1    Dec. 6, 2012

(51) Int. Cl.
*G01R 1/067*    (2006.01)

(52) U.S. Cl.
USPC ............. 324/755.02; 324/756.03; 324/755.01

(58) Field of Classification Search
USPC ..................................................... 324/755.02
See application file for complete search history.

(56) References Cited

U.S. PATENT DOCUMENTS

| 6,392,306 | B1 * | 5/2002 | Khandros et al. | 257/783 |
| 7,349,223 | B2 * | 3/2008 | Haemer et al. | 361/767 |
| 7,621,761 | B2 * | 11/2009 | Mok et al. | 439/81 |

* cited by examiner

*Primary Examiner* — Thomas F Valone
(74) *Attorney, Agent, or Firm* — Mark Gonzales

(57) ABSTRACT

In one embodiment, the present invention includes an apparatus for contacting a plurality of contact locations of a semiconductor device. The apparatus includes a housing, a support member, a plurality of probe members, and an adhesive substance. The housing has a plurality of apertures that provides a low leakage pathway for high frequency signals to reach the semiconductor device through the plurality of probe members. The plurality of probe members are aligned on the support member and the adhesive substance secures the plurality of probe members to the supporting member. The housing, supporting member, and adhesive substance match in thermal expansion to reduce the error in alignment between the plurality of contact locations and the plurality of probe members over a temperature variance.

19 Claims, 12 Drawing Sheets

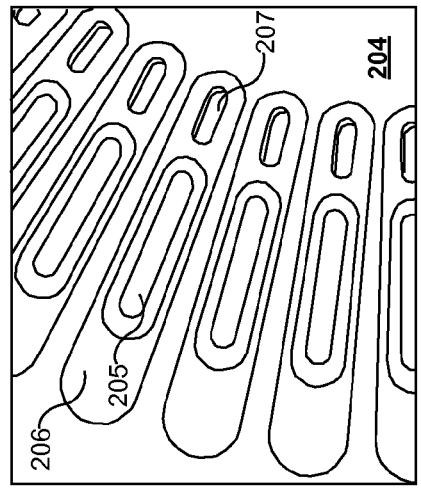
Fig. 2C
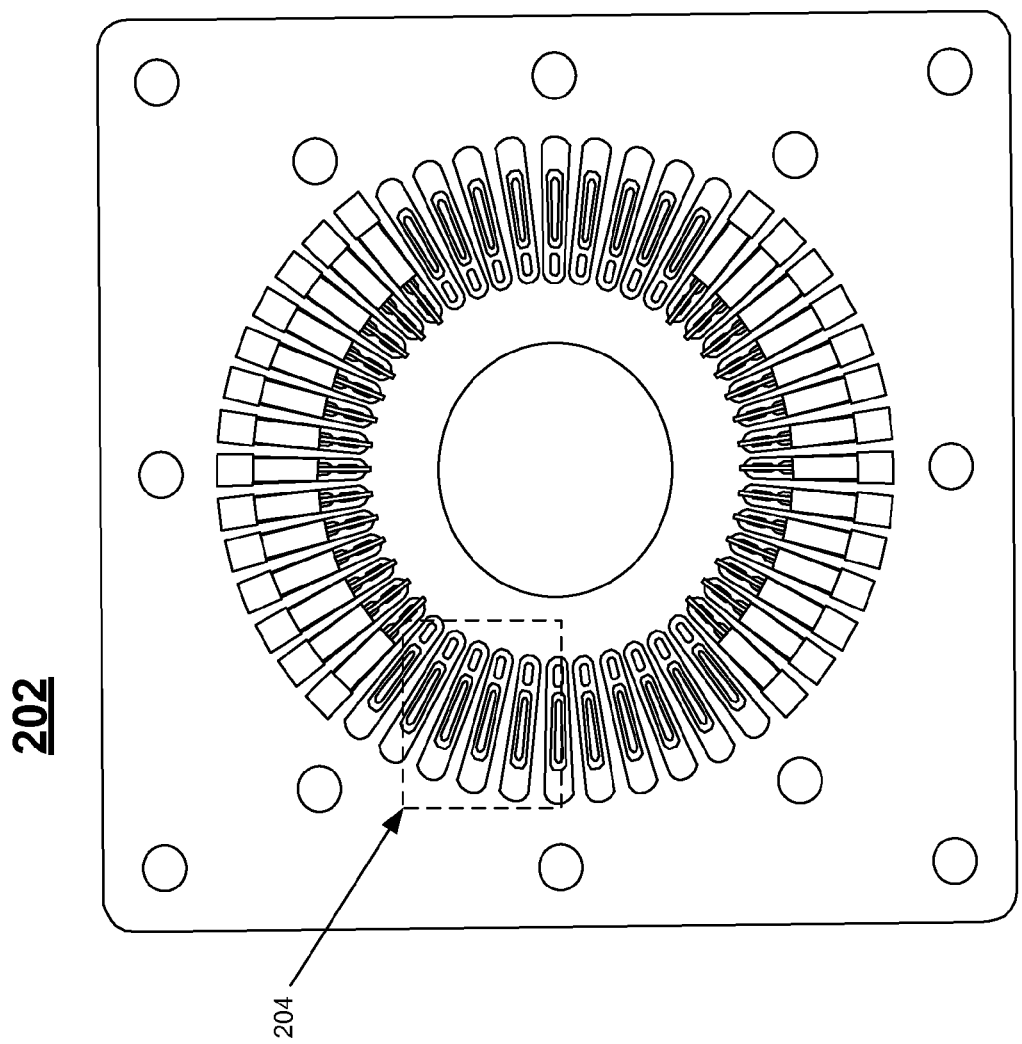

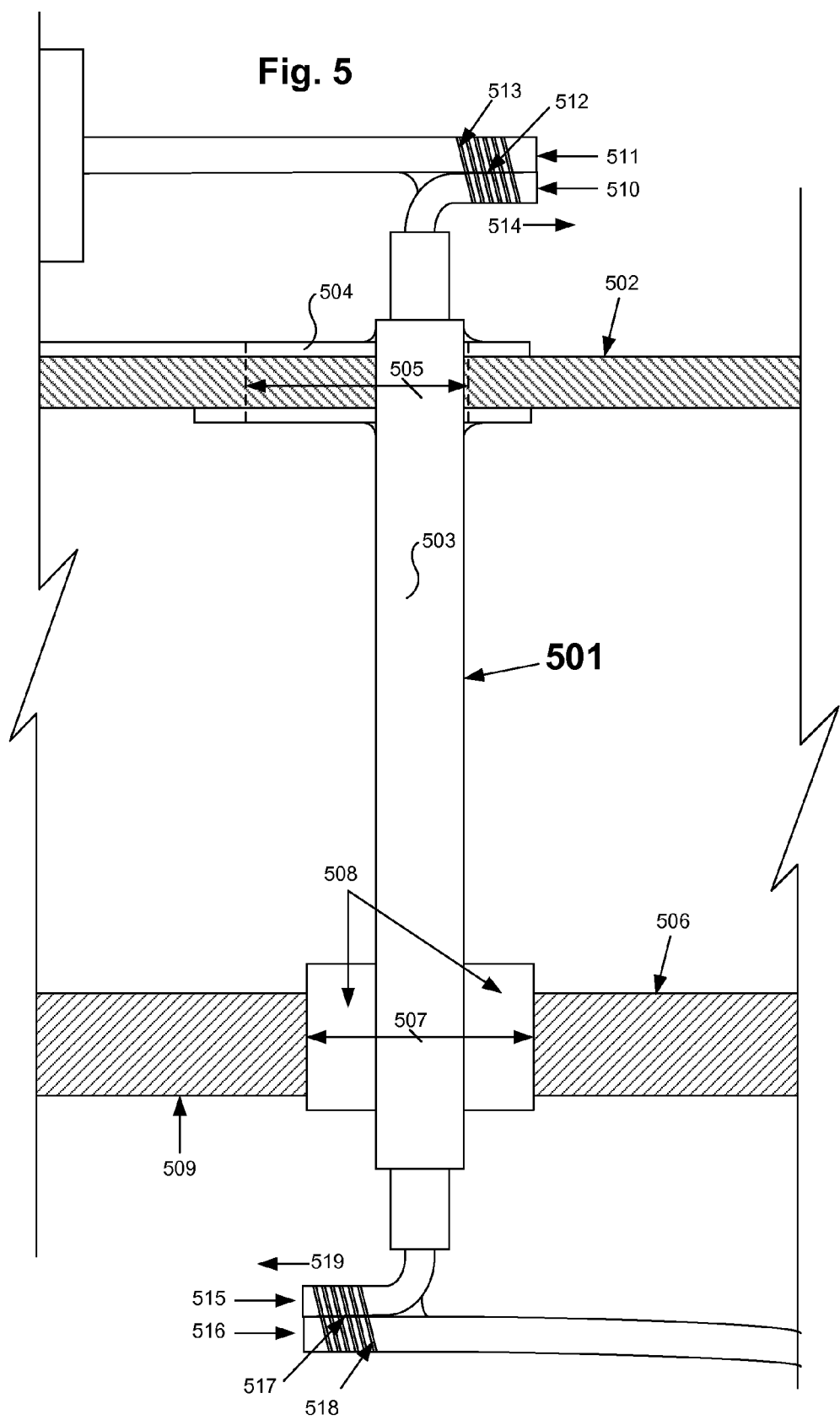

HIGH TEMPERATURE-LOW LEAKAGE PROBE APPARATUS AND METHOD OF MANUFACTURING SAME

CROSS REFERENCE TO RELATED APPLICATIONS

Not applicable.

BACKGROUND

The present invention relates to semiconductor probe apparatus, and in particular, to probe apparatus having low leakage over a wide range of temperature and method of making such an apparatus.

Probe cards and assemblies are used to make electrical contact with the pads of a semiconductor device during wafer sort testing. Probe cards are typically fabricated from a FR-4 PCB (Printed Circuit Board) having metalized fingers which allow a probe ring to be attached. The probe ring supports a pattern of probes aligned and angled to make contact with the pads of the specific semiconductor device. The other end of the probes may protrude out of the probe ring so that the ends may be soldered onto the fingers of the probe card. Having well aligned probes provides for consistent electrical and mechanical contact with the semiconductor device. Inconsistent contact alignment and force may result when temperature (e.g. hot chuck) testing above 100° C. or over a large temperature range. Temperature testing may reduce the life of the probe card.

Smaller semiconductor structures with higher performance have driven probe card technologies to their limits in performance and reliability. Higher frequency devices require less leakage, and the smaller footprint requires more precise probe alignment. Temperature testing of these high performance devices may result in inconsistent probing and inaccurate measurements. In many applications the probe card described above may be incapable of providing the low leakage stable contact required for temperature testing.

Thus, there is a need for improved probe apparatus. The present invention solves these and other problems by providing high temperature-low leakage probe apparatus and method of making same.

SUMMARY

Embodiments of the present invention include a probe apparatus for contacting a plurality of contact locations of a semiconductor device probe. The apparatus includes a housing, a support member, a plurality of probe members, and an adhesive substance. The housing has a plurality of apertures that provides a low leakage pathway for high frequency signals to reach the semiconductor device through the plurality of probe members. The plurality of probe members are aligned on the support member and the adhesive substance secures the plurality of probe members to the supporting member. The housing, supporting member, and adhesive substance match in thermal expansion to reduce the error in alignment between the plurality of contact locations and the plurality of probe members over a temperature variance.

In another embodiment, the invention includes a method of manufacturing an apparatus for contacting a plurality of contact locations of a semiconductor device. The method includes attaching, installing, inserting, securing, and connecting. The attaching includes attaching a plurality of coaxial cables to a low leakage laminate. The installing includes installing a plurality of micro-coaxial segments into the low leakage laminate. The inserting includes inserting each of the plurality of micro-coaxial segments into a corresponding aperture of a plurality of apertures of the housing. A portion of each micro-coaxial segment of the plurality of micro-coaxial segments extends below a lower surface of the housing. The securing includes securing the low leakage laminate to the housing. The attaching includes attaching a support member to the housing such that the support member protrudes below the lower surface. A plurality of probe members is aligned on the support member to contact the plurality of contact locations. The connecting includes connecting each probe member of the plurality of probe members to a corresponding end of each micro-coaxial segment of the plurality of micro-coaxial segments.

In yet another embodiment, the invention includes a probe apparatus for contacting a plurality of contact locations of a semiconductor device. The probe apparatus includes a housing, a probe assembly, a board, a plurality of micro-coaxial segments, and a plurality of coaxial cables. The housing is constructed primarily of metal and has a plurality of apertures of a first insulator material. The probe assembly includes a second insulator material which protrudes below a lower surface of the housing and is attached to the housing. The board includes a third insulator material and is attached to the housing above the lower surface. The probe assembly includes a support member of the second insulator disposed with a plurality of probe members aligned to contact the plurality of contact locations. The board includes a plurality of plated through holes corresponding to the plurality of apertures. An outer conductor of each of the plurality of micro-coaxial segments is soldered within a corresponding plated through hole of the plurality of plated through holes. Each coaxial cable of the plurality of coaxial cables couples to a corresponding micro-coaxial segment of the plurality of micro-coaxial segments. Each micro-coaxial segment passes through a corresponding aperture of the plurality of apertures. Each micro-coaxial segment includes a first portion of center conductor exposed below the lower surface of the housing. The first portion of each micro-coaxial segment is coupled to a corresponding probe member of the plurality of probe members, and wherein the first insulator, the second insulator, the third insulator, the micro-coaxial segments, and the coaxial cables provide a low leakage pathway.

The following detailed description and accompanying drawings provide a better understanding of the nature and advantages of the present invention.

BRIEF DESCRIPTION OF THE DRAWINGS

FIG. 2C illustrates a top view of low leakage laminate board.

FIG. 5 illustrates a micro-coaxial segment installed into a cross section of a low leakage board.

DETAILED DESCRIPTION

Described herein are techniques for high temperature-low leakage probe apparatus and method for making same. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1A:
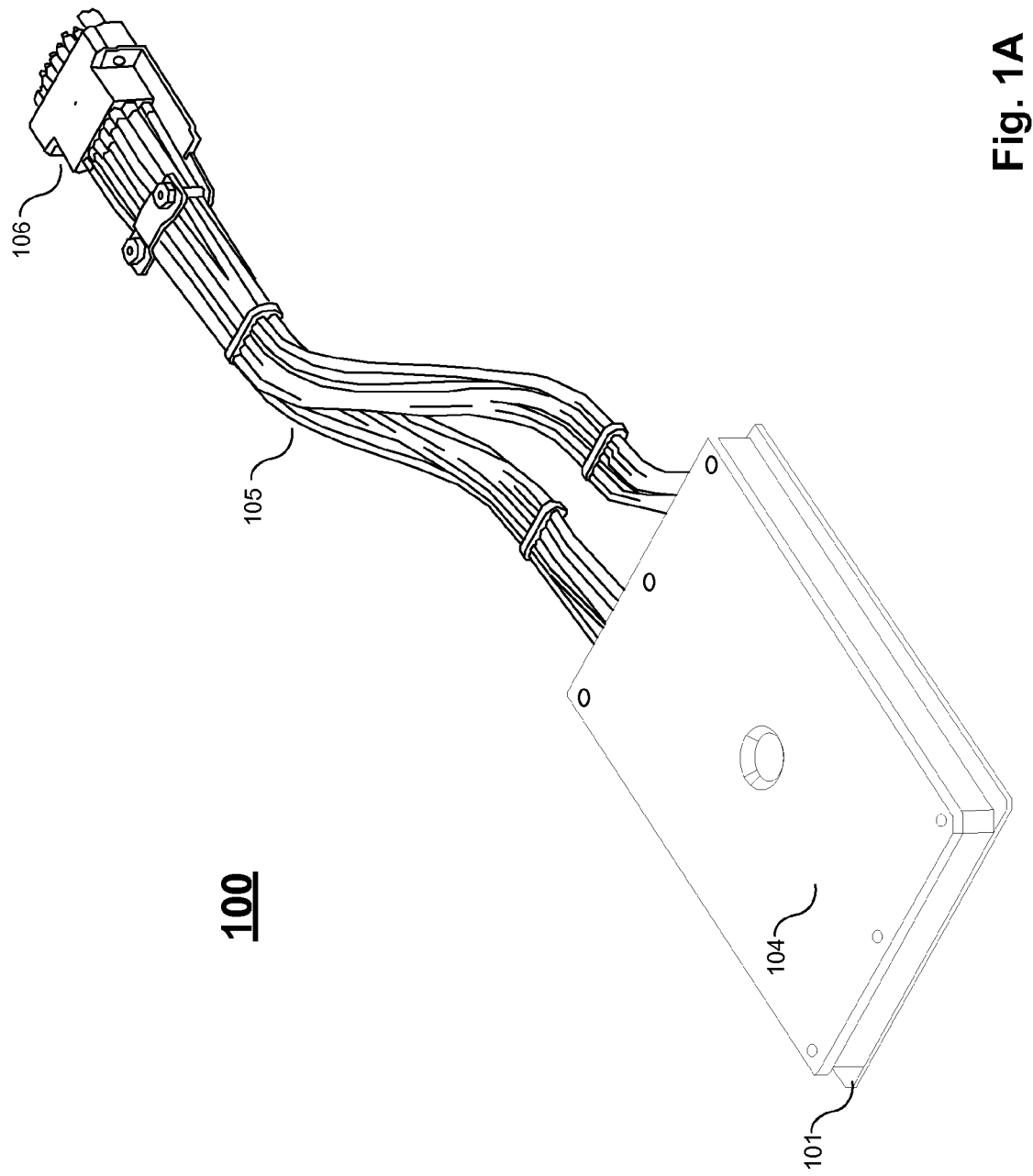
FIGS. 1A-1B illustrate an apparatus according to one embodiment of the present invention.
Figure 1B:
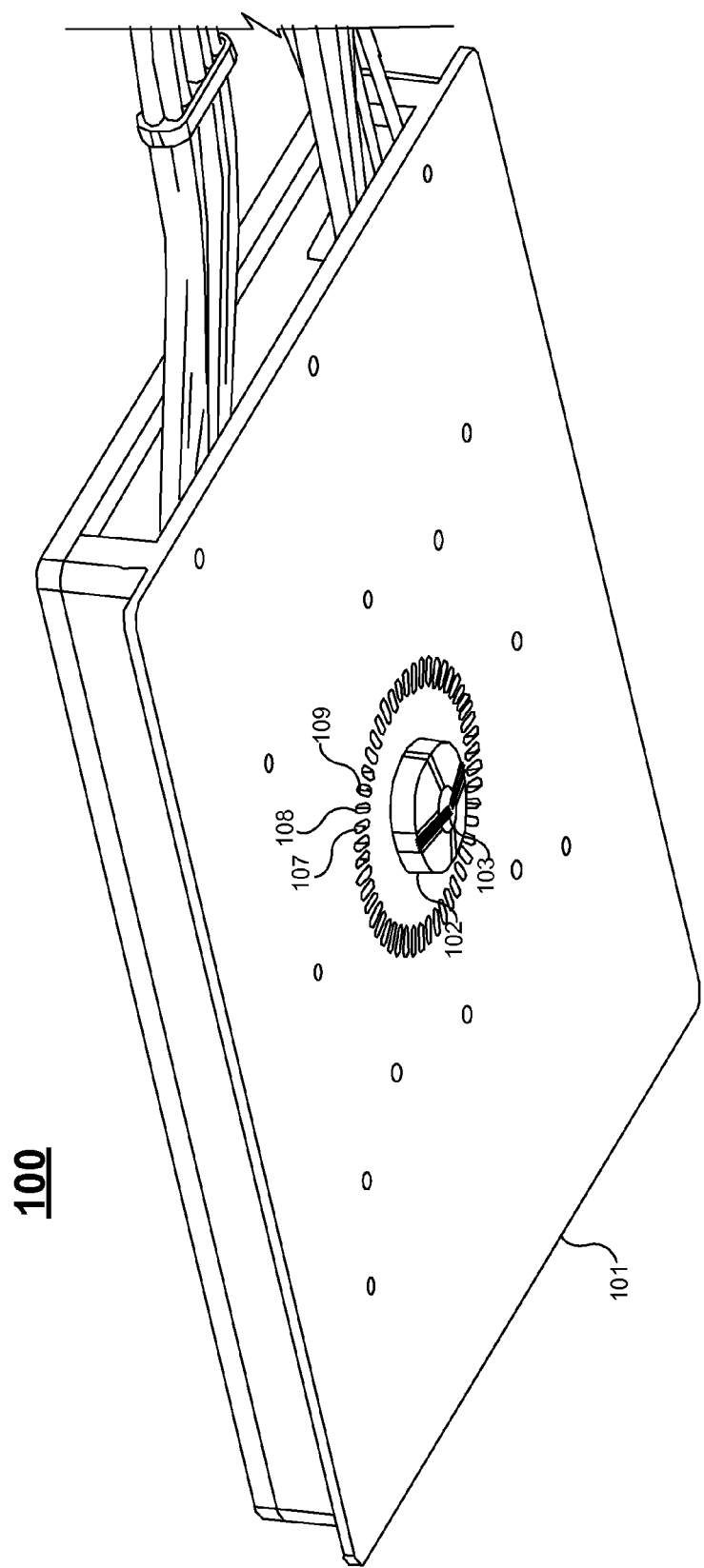

FIGS. 1A-1B illustrate an apparatus 100 according to one embodiment of the present invention. Apparatus 100 includes a housing 101, a support member 102, a plurality of probe members 103, and an adhesive substance (not shown). FIG. 1A illustrates a top view of apparatus 100. Housing 101 includes a cover plate 104. A plurality of coaxial cables 105 exit the housing 101 and are coupled to connector 106. Connector 106 may connect to automatic test equipment (ATE) having digital and analog instruments to source and measure various signals. Housing 101 may be attached to an automated prober (not shown) in order to interface with semiconductor wafers.

FIG. 1B illustrates a bottom view of apparatus 100. Support member 102 may be constructed from an insulator material such as ceramic and may be attached to housing 101 by an epoxy, for example. Support member 102 may be constructed to have a particular probe depth. The probe depth may also be designed to provide a particular temperature gradient from the tips of the plurality of probe members 103 to housing 101.

Support member 102 has a plurality of probe members 103 aligned on its surface. The surface of support member 102 may be used to provide the plurality of probe members 103 with a particular probe angle. An adhesive substance (e.g. low resistivity epoxy) may secure the plurality of probe members 103 to support member 102. Housing 101, supporting member 102, and the adhesive substance may have matching coefficients of thermal expansion (CTEs) such that the materials move together when exposed to temperature extremes. This may prevent stresses within apparatus 100, especially between housing 101, supporting member 102, and the plurality of probe members 103. This matching may reduce an error in alignment between a plurality of contact locations and the plurality of probe members over a temperature variance.

Housing 101 includes a plurality of apertures (e.g. 107-109) to provide a low leakage pathway for electrical coupling from the plurality of coaxial cables 105 to a semiconductor device via the plurality of probe members 103 (note: the relative size of the probe members in FIG. 1B does not allow for a depiction of the probe members coupling to conductors emanating from the plurality of apertures).

Figure 2A:
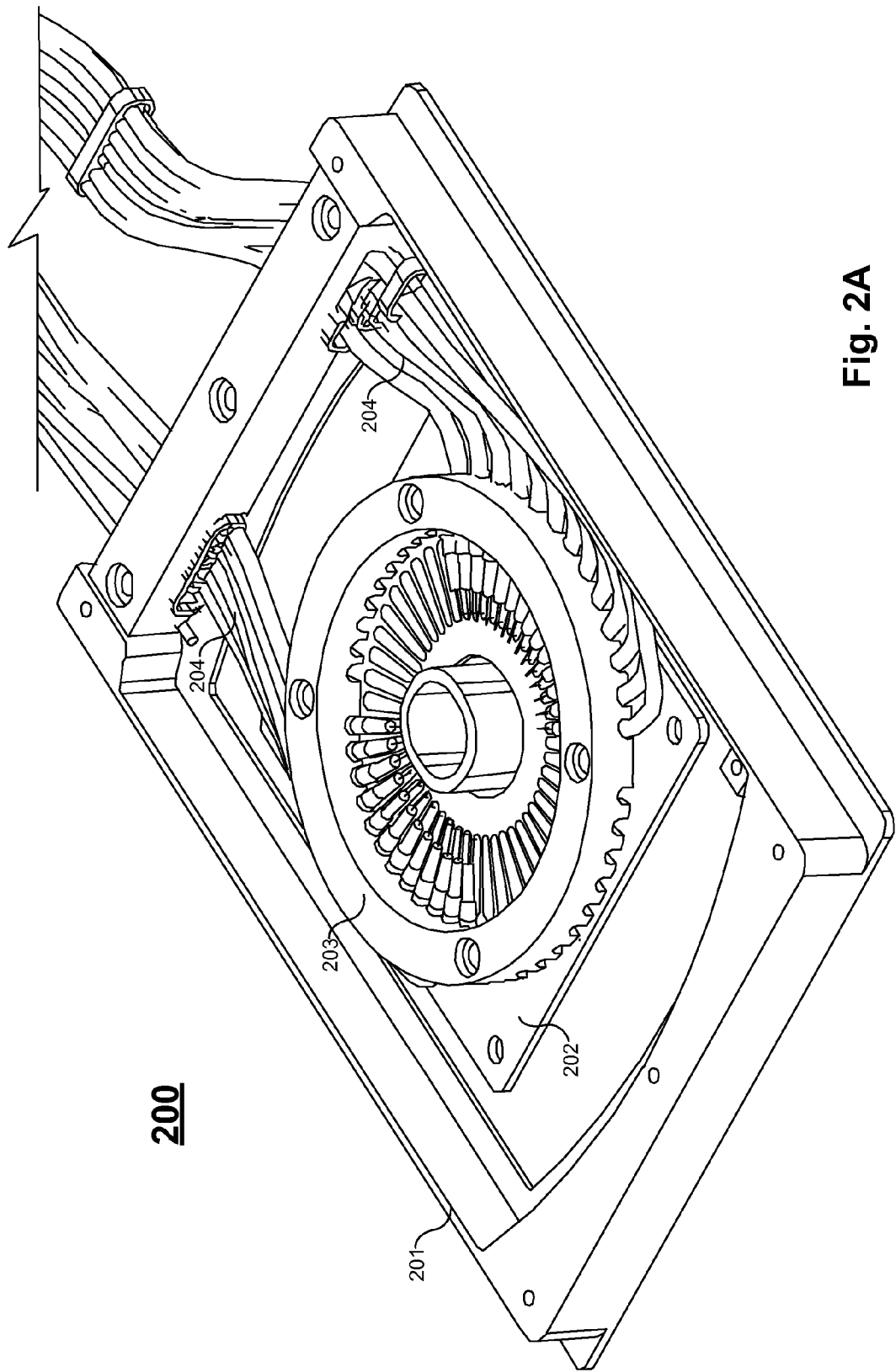
FIG. 2A-2B illustrates details within the housing of an apparatus according another embodiment of the present invention.
Figure 2B:
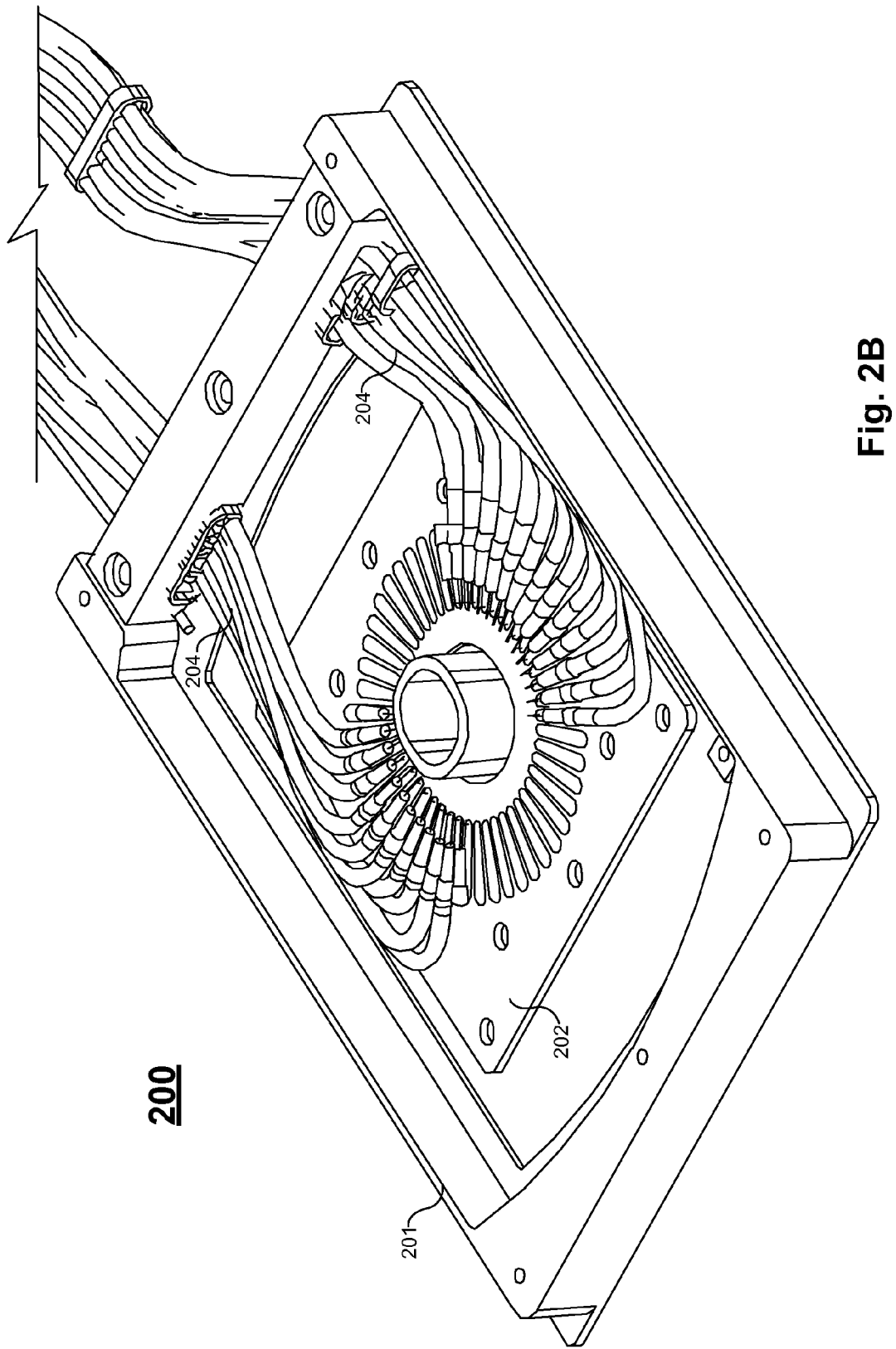

FIG. 2A-2B illustrates details within the housing 201 of apparatus 200 according another embodiment of the present invention. Apparatus 200 includes a low leakage laminate board 202 coupled on top of an upper surface of housing 201. Cable fixture 203 guides the plurality of cables 204 to locations on low leakage laminate board 202. FIG. 2B illustrates apparatus 200 without the cable fixture 203 (of FIG. 2A) in order to make more detail visible.

FIG. 2C illustrates a top view of low leakage laminate board 202. Low leakage laminate board 202 includes a plurality of guarded traces. Detail 204 shows trace 205 with guard 206 and plated through hole 207. The plurality of plated through holes correspond to the plurality of apertures of housing 101 of FIG. 1B and provide a means for securing a plurality of coaxial conductors vertically through housing 101. Low leakage laminate board 202 may be made of an insulator material such as Rogers material, for example. One specific example of Rogers material is the RO4003 series of high frequency circuit materials.

Figure 3A:
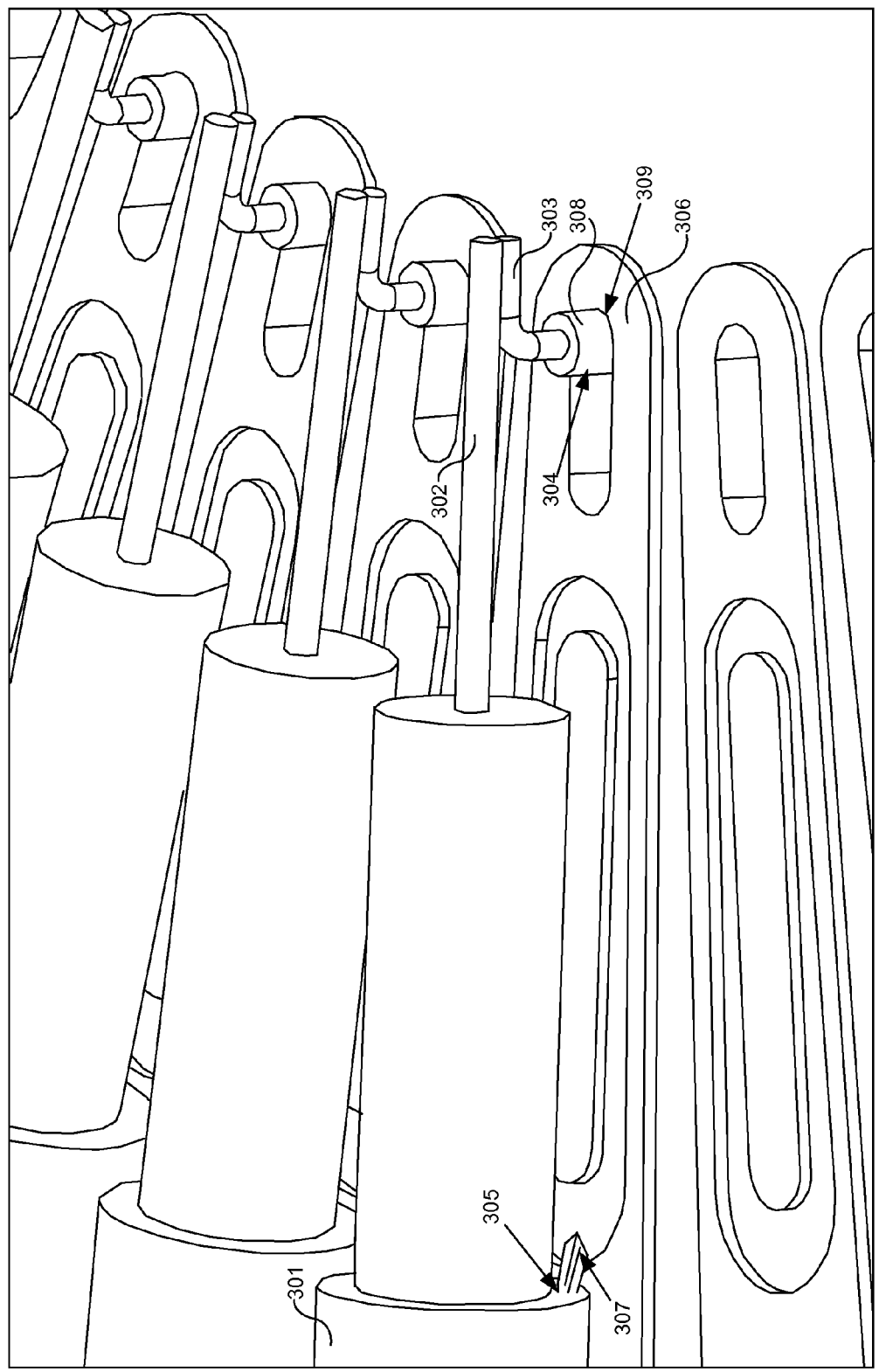
FIG. 3A illustrates coaxial to coaxial coupling according to one embodiment of the present invention.

FIG. 3A illustrates a coaxial to coaxial coupling according to one embodiment of the present invention. Coaxial cable 301 includes center conductor 302 which couples to the center conductor 303 of micro-coaxial segment 304. Center conductor 303 has a bend to aid in the coupling of center conductor 302 to center conductor 303. Center conductor 302-303 may be coupled by soldering, wounding micro-wire around them, mechanically welding the two together, or any combination of coupling therein. For example, micro-wire having a 1 mil in diameter may be wound with surgical instruments in some applications. Outer conductor 305 of coaxial cable 301 may be coupled to guard trace 306 at point 307. Outer conductor 308 may be coupled to guard trace 306 at plated through hole 309.

Figure 3B:
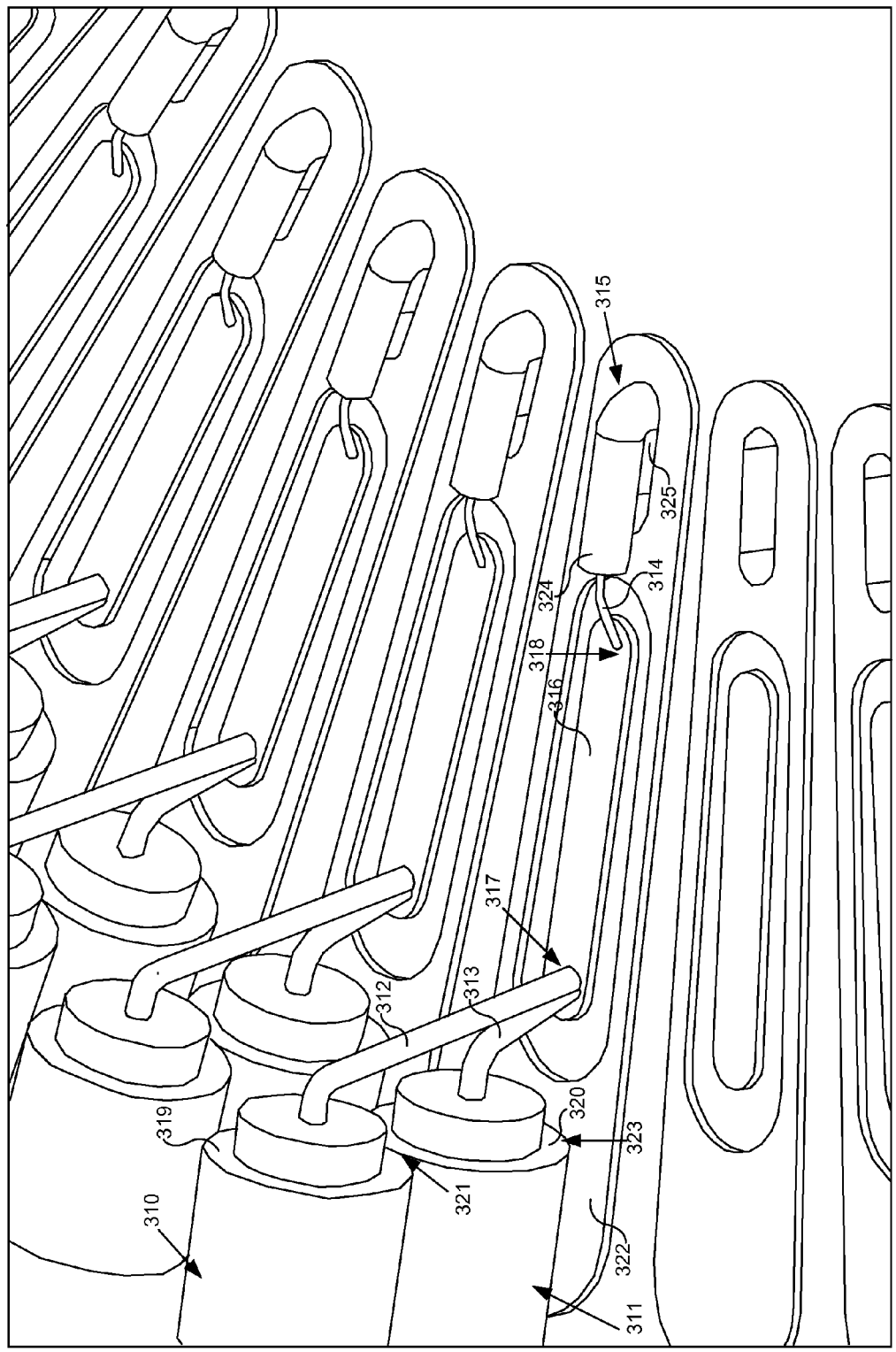
FIG. 3B illustrates coaxial to coaxial coupling according to yet another embodiment of the present invention.

FIG. 3B illustrates one coaxial to coaxial coupling according to another embodiment of the present invention. Coaxial cables 310-311 includes center conductors 312-313 (respectively) which couples to the center conductor 314 of micro-coaxial segment 315. Center conductor 312-313 may be soldered to trace 316 at point 317, and center conductor 314 may be soldered to trace 316 at point 318. Coaxial cables 310-311 provide a Kelvin connection to point 317. Outer conductors 319-320 may be coupled together at region 321 and coupled to guard trace 322 at region 323. Outer conductor 324 may be coupled to guard trace 322 at plated through hole 325. Trace 316 is a guarded trace due to the proximity of guard trace 322.

Figure 3C:
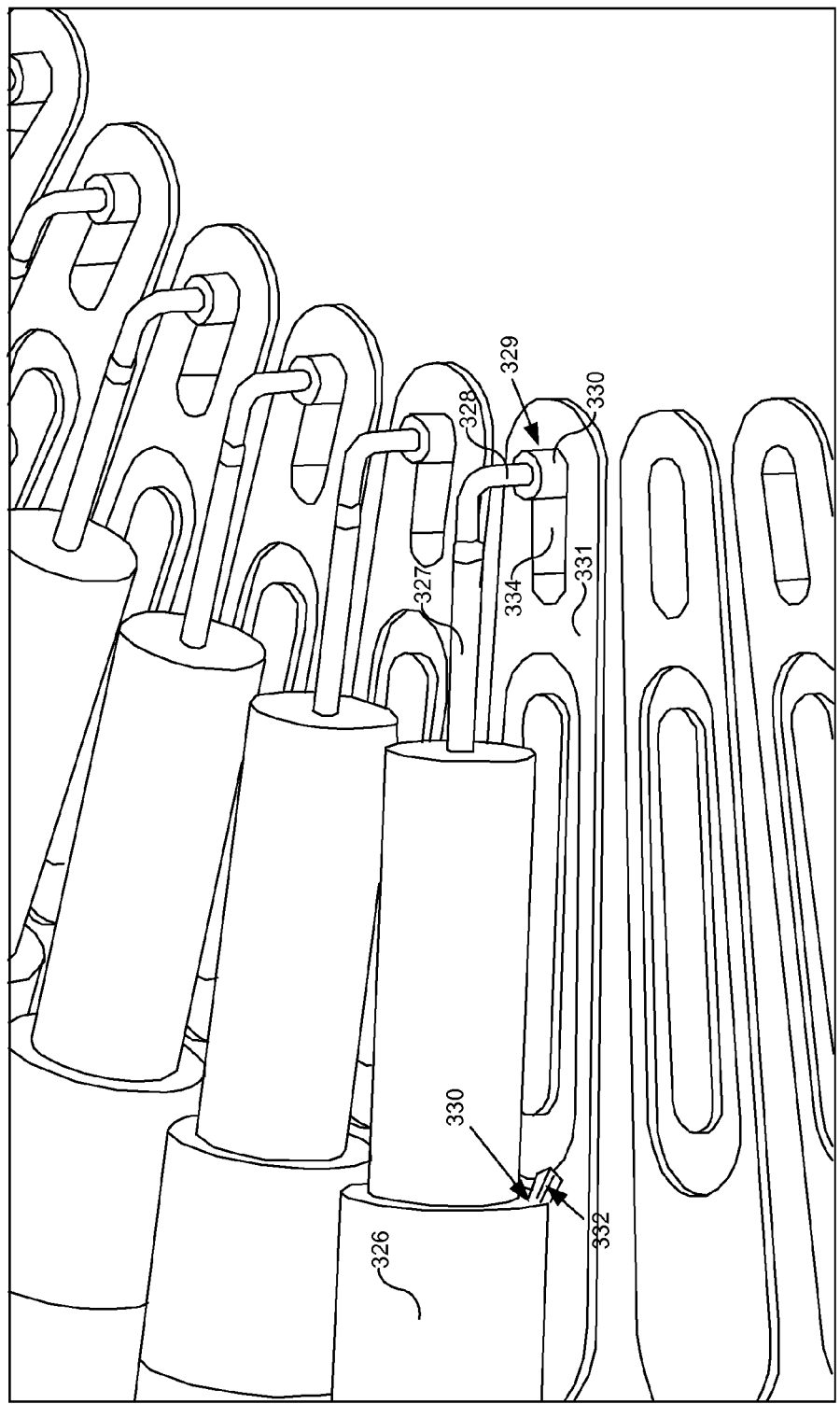
FIG. 3C illustrates coaxial to coaxial coupling according to yet another embodiment of the present invention.

FIG. 3C illustrates a coaxial to coaxial coupling according to yet another embodiment of the present invention. Coaxial cable 326 includes center conductor 327 which couples to the center conductor 328 of micro-coaxial segment 329. Center conductors 327-328 may coupled together through mechanical welding and/or soldering in this embodiment. Outer conductor 330 of coaxial cable 326 may be coupled to guard trace 331 at point 332. Outer conductor 333 may be coupled to guard trace 331 at plated through hole 334. In an assembly of this embodiment, the leakage was specified as 1 fA/V (1 Femto Amp per Volt) at room temperature.

Figure 4A:
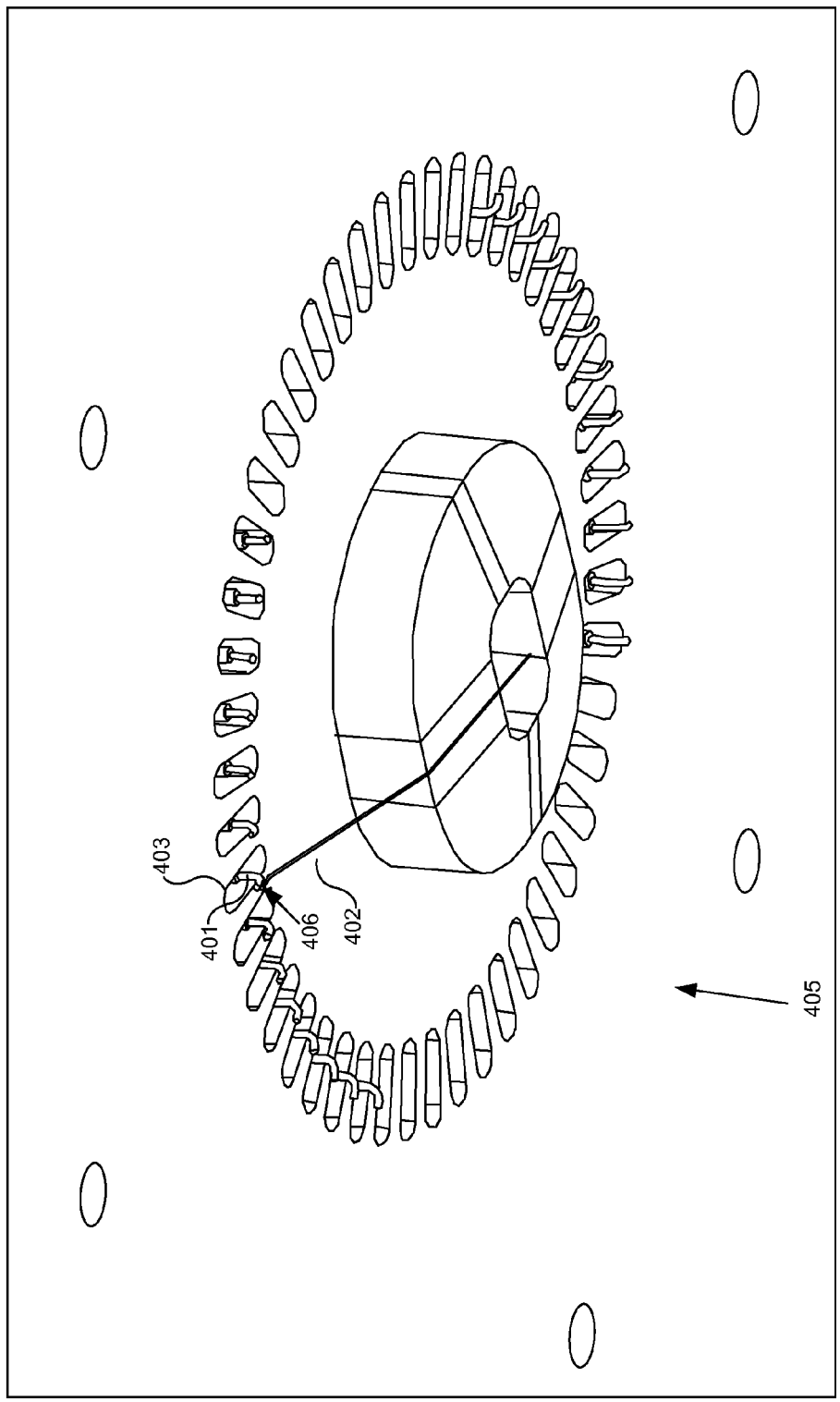
FIG. 4A illustrates a view demonstrating the coupling of one micro-coaxial segment to a corresponding probe member.

FIG. 4A illustrates a view demonstrating the coupling of one micro-coaxial segment 401 to a corresponding probe member 402. Each micro-coaxial segment passes through a corresponding aperture (e.g. 403) of a plurality of apertures. Each coaxial-segment may include a portion of center conductor exposed below the lower surface of the housing 405. The exposed center conductor 406 couples to a corresponding probe member 402.

Figure 4B:
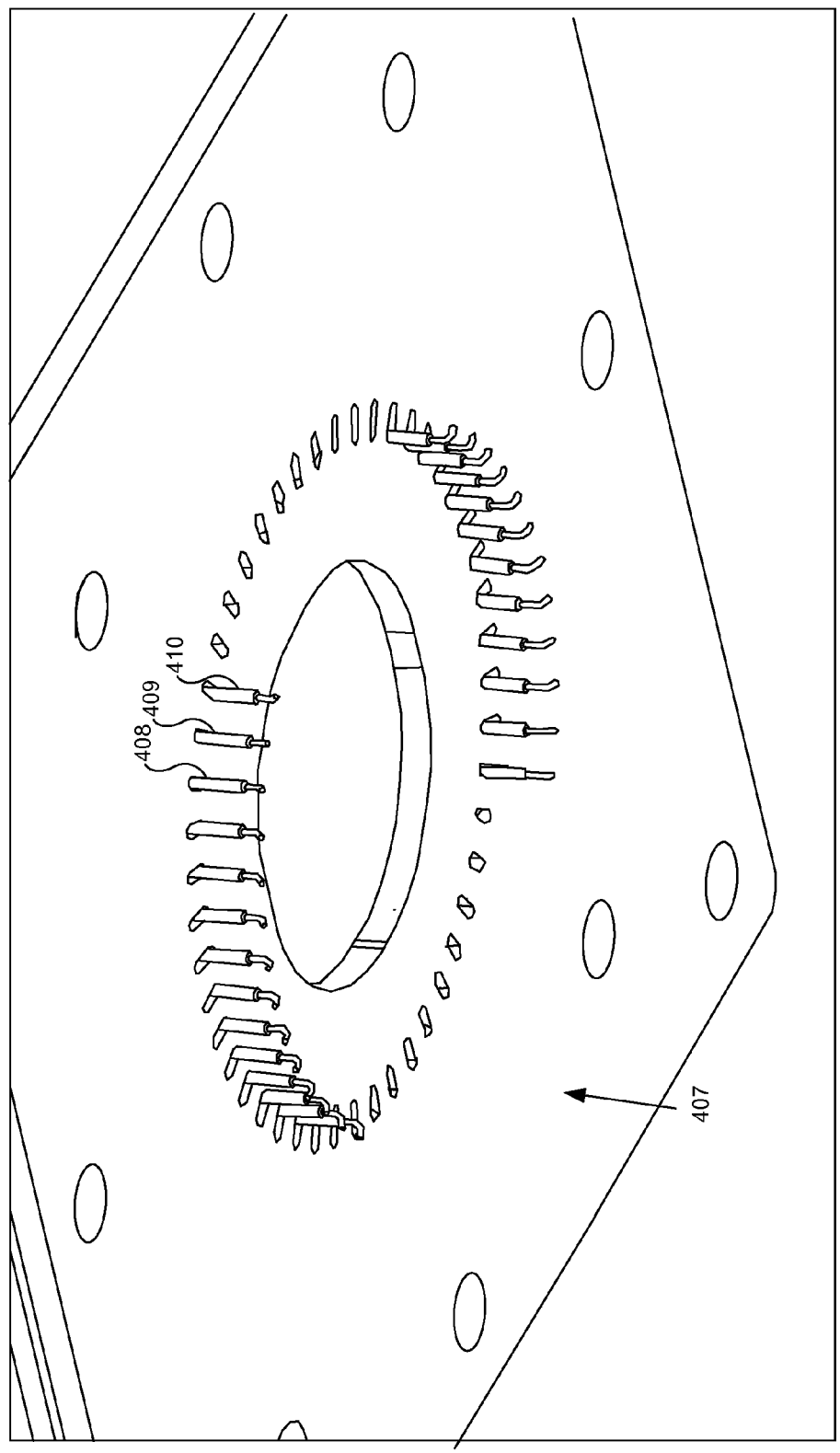
FIG. 4B illustrates a view of a low leakage board prior to mounting the low leakage board to the housing.

FIG. 4B illustrates a view of low leakage board 407 having a plurality of micro-coaxial segments emanating from a plurality of plated through holes prior to mounting low leakage board 407 to housing 405 (shown in FIG. 4A). This view may show an intermediate assembly step in which a plurality of coaxial cables (not visible in this view) have been attached to low leakage board 407 and a corresponding plurality of micro-coaxial segments (e.g. 408-410) have been installed.

FIG. 5 illustrates a micro-coaxial segment 501 installed into a cross section of low leakage board 502 and positioned into aperture 507 of a cross section of housing 506. Micro-coaxial segment 501 may be a semi-rigid coaxial member, for example. Micro-coaxial segment 501 includes an outer conductor 503 coupled to guard trace 504 and guard through hole 505 by a solder joint. Housing 506 may be primarily constructed of metal such as stainless steel, for example. Housing 506 may have apertures (e.g. aperture 507) of insulator material 508 such as Teflon, for example. Outer conductor 503 may be mechanically supported by aperture 507 and material 508 which also provide a low leakage pathway for high frequency signals to pass through housing 506 to probe member 516.

Micro-coaxial segment 501 includes a portion 510 of center conductor coupled to a center conductor 511 of a coaxial cable. Portion 510 of micro-coaxial segment 501 is exposed above a lower surface 509 of housing 506 and may be bent at an angle to couple to center conductor 511 at point 512. The angle allows portion 510 to point in direction 514 corresponding to an approach of the coaxial cable. Micro-wire 513 is wound around portion 510 of center conductor and center conductor 511. Portion 510 of center conductor and center conductor 511 may also be soldered together as shown in FIG. 5.

Micro-coaxial segment 501 includes a portion 515 of center conductor coupled to a probe member 516. Portion 515 of micro-coaxial segment 501 is exposed below the lower surface 509 of housing 506 and may be bent at an angle to couple to probe member 516 at point 517. The angle allows portion 515 to point in direction 519 corresponding to an approach of probe member 516. Micro-wire 518 is wound around portion 515 of center conductor and probe member 516. Portion 515 of center conductor and probe member 516 may also be soldered together as shown in FIG. 5.

Figure 6:
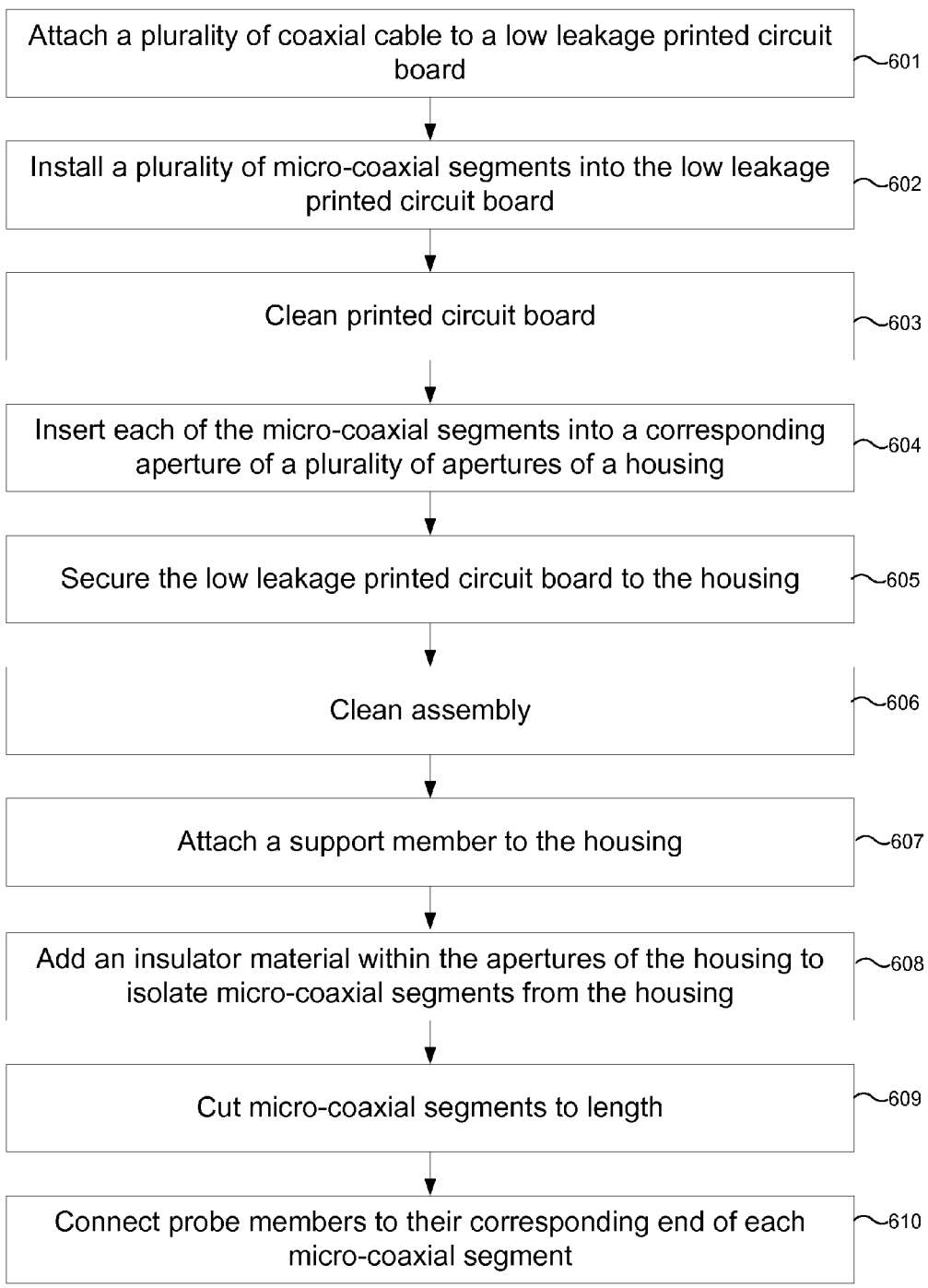
FIG. 6 illustrates a method of manufacturing an apparatus according to one embodiment of the present invention.

FIG. 6 illustrates method 600 of manufacturing an apparatus for contacting a plurality of contact locations of a semiconductor device according to one embodiment of the present invention.

At 601, attach a plurality of coaxial cable to a low leakage PCB. The PCB may be a low leakage laminate.

At 602, install a plurality of micro-coaxial segments into the low leakage PCB. The installing may include soldering an outer conductor of each of the micro-coaxial segments within a corresponding plated through hole of a plurality of plated through holes. The low leakage PCB includes the plurality of plated through holes which correspond to a plurality of apertures of a housing.

In one embodiment, installing further comprises exposing a upper portion of center conductor of each micro-coaxial segment above the lower surface of the housing, and soldering the upper portion of each micro-coaxial segment to a corresponding center conductor of the plurality of coaxial cables. In another embodiment, installing further comprises bending the upper portion of each micro-coaxial segment at an angle to improve coupling during the soldering of the upper portion. In yet another embodiment, installing further comprises winding a micro-wire around the upper portion of each micro-coaxial segment and the center conductor of the corresponding coaxial cable. The angle may allow the upper portion to point in a direction corresponding to an approach of the corresponding coaxial cable, thereby aiding in winding of the micro-wire.

At 603, clean the PCB. Flux and solder may be removed to reduce conductive pathways which may cause leakage.

At 604, insert each of the plurality of micro-coaxial segments into a corresponding aperture of a plurality of apertures of the housing. A portion of each micro-coaxial segment of the plurality of micro-coaxial segments may extend below a lower surface of the housing.

At 605, secure the low leakage PCB to the housing. Screws may be used with corresponding threaded holes machined into the housing, for example.

At 606, clean the current assembly including coaxial cables, micro-coaxial segments, PCB, and housing. Contaminates may be removed to prevent inadvertent pathways which may cause leakage.

At 607, attach a support member to the housing such that the support member protrudes below the lower surface of the housing. A plurality of probe members may be aligned on the support member to contact a plurality of contact locations of a semiconductor device or multiple semiconductor devices.

At 608, add an insulator material within the apertures of the housing to isolate micro-coaxial segments from the housing. The insulator material may be in the form of Teflon tubing, for example.

At 609, cut micro-coaxial segments to length.

At 610, connect each probe member of the plurality of probe members to a corresponding end of each micro-coaxial segment of the plurality of micro-coaxial segments. In one embodiment, connecting includes exposing a lower portion of center conductor of each micro-coaxial segment below the lower surface of the housing and soldering the lower portion of each micro coaxial segment to a corresponding probe member of the plurality of probe members. In an alternate embodiment, connecting further comprises bending the lower portion of each micro-coaxial segment at an angle to improve coupling during the soldering. In yet another embodiment, connecting further comprises winding a micro-wire around the lower portion of each micro-coaxial segment and the segment of the corresponding probe member. The angle may allow the lower portion to point in a direction corresponding to an approach of the corresponding probe member, thereby aiding in winding of the micro-wire.

The above description illustrates various embodiments of the present invention along with examples of how aspects of the present invention may be implemented. The above examples and embodiments should not be deemed to be the only embodiments, and are presented to illustrate the flexibility and advantages of the present invention. Based on the above disclosure, other arrangements, embodiments, implementations and equivalents will be evident to those skilled in the art and may be employed without departing from the spirit and scope of the invention.

What is claimed is:

1. A probe apparatus for contacting a plurality of contact locations of a semiconductor device, said probe apparatus comprising:
   a housing having a plurality of apertures;
   a support member protruding below a lower surface of said housing and attached to said housing;
   a plurality of probe members aligned on said support member to contact said plurality of contact locations; and
   an adhesive substance securing said plurality of probe members to said supporting member,
   wherein said housing, said supporting member, and said adhesive substance match in thermal expansion to reduce an error in alignment between said plurality of contact locations and said plurality of probe members over a temperature variance, and
   wherein said plurality of apertures provide a low leakage pathway for electrical coupling to said semiconductor device via said plurality of probe members; and
   further comprising a plurality of micro-coaxial segments, wherein each micro-coaxial segment passes through a corresponding aperture of the plurality of apertures, wherein each micro-coaxial segment includes a first portion of center conductor exposed below said lower surface of said housing, and wherein said first portion of each micro-coaxial segment is coupled to a corresponding probe member of the plurality of probe members.

2. The apparatus of claim 1 wherein said first portion of each micro-coaxial segment is bent at an angle to couple to a segment of said corresponding probe member.

3. The apparatus of claim 2 wherein a micro-wire is wound around said first portion of each micro-coaxial segment and said segment of said corresponding probe member, wherein said angle allows said first portion to point in a direction corresponding to an approach of said corresponding probe member, thereby aiding in winding of said micro-wire.

4. The apparatus of claim 1 further comprising a plurality of coaxial cables, wherein each of said micro-coaxial segments includes a second portion of center conductor exposed above said lower surface of said housing to couple to a center conductor of a corresponding coaxial cable of said plurality of coaxial cables.

5. The apparatus of claim 4 wherein said second portion of each micro-coaxial is bent at an angle to couple to said center conductor of said corresponding coaxial cable.

6. The apparatus of claim 5 wherein a micro-wire is wound around said second portion of each micro-coaxial segment and said center conductor of said corresponding coaxial cable, wherein said angle allows said second portion to point in a direction corresponding to an approach of said corresponding coaxial cable, thereby aiding in winding of said micro-wire.

7. The apparatus of claim 4 further comprising a low leakage laminate coupled on top of an upper surface of said housing, wherein said low leakage laminate includes a plurality of plated through holes having locations corresponding to said plurality of apertures of said housing, wherein an outer conductor of each of said micro-coaxial segments is soldered within a corresponding plated through hole of the plurality of plated through holes.

8. The apparatus of claim 7 wherein said low leakage laminate includes Rogers material.

9. The apparatus of claim 7 wherein said low leakage laminate includes a plurality of guarded traces, wherein said second portion of each of said micro-coaxial segments couples to said center conductor of said corresponding coaxial cable through a corresponding guarded trace of the plurality of guarded traces.

10. A method of manufacturing an apparatus for contacting a plurality of contact locations of a semiconductor device, said method comprising:

attaching a plurality of coaxial cables to a low leakage laminate;

installing a plurality of micro-coaxial segments into said low leakage laminate;

inserting each of said plurality of micro-coaxial segments into a corresponding aperture of a plurality of apertures of a housing, wherein a portion of each micro-coaxial segment of said plurality of micro-coaxial segments extends below a lower surface of said housing;

securing said low leakage laminate to said housing;

attaching a support member to said housing such that said support member protrudes below said lower surface, wherein a plurality of probe members is aligned on said support member to contact said plurality of contact locations; and connecting each probe member of said plurality of probe members to a corresponding end of each micro-coaxial segment of said plurality of micro-coaxial segments.

11. The method of claim 10 wherein installing further comprises:

exposing a first portion of center conductor of each micro-coaxial segment below said lower surface of said housing; and soldering said first portion of each micro coaxial segment to a corresponding probe member of the plurality of probe members.

12. The method of claim 11 wherein installing further comprises bending said first portion of each micro-coaxial segment at an angle to improve coupling during said soldering.

13. The method of claim 12 wherein installing further comprises winding a micro-wire around said first portion of each micro-coaxial segment and said segment of said corresponding probe member, wherein said angle allows said first portion to point in a direction corresponding to an approach of said corresponding probe member, thereby aiding in winding of said micro-wire.

14. The method of claim 11 wherein connecting further comprises:

exposing a second portion of center conductor of each said micro-coaxial segment above said lower surface of said housing;

soldering said second portion of each micro-coaxial segment to a corresponding center conductor of said plurality of coaxial cables.

15. The method of claim 14 wherein connecting further comprises bending said second portion of each micro-coaxial segment at an angle to improve coupling during said soldering said second portion.

16. The method of claim 15 wherein connecting further comprises winding a micro-wire around said second portion of each micro-coaxial segment and said center conductor of said corresponding coaxial cable, wherein said angle allows said second portion to point in a direction corresponding to an approach of said corresponding coaxial cable, thereby aiding in winding of said micro-wire.

17. The method of claim 10 wherein installing said plurality of micro-coaxial segments to said low leakage laminate includes soldering an outer conductor of each of said micro-coaxial segments within a corresponding plated through hole of a plurality of plated through holes, wherein said low leakage laminate includes said plurality of plated through holes having locations corresponding to said plurality of apertures of said housing.

18. The method of claim 10 wherein installing further comprises:

soldering an exposed center conductor each of said micro-coaxial segments to a corresponding guarded trace of a plurality of guarded traces disposed on said low leakage laminate; and soldering an exposed center conductor of a corresponding coaxial cable to said corresponding guarded trace.

19. A probe apparatus for contacting a plurality of contact locations of a semiconductor device, said probe apparatus comprising:

a housing constructed primarily of metal and having a plurality of apertures of a first insulator material;

a probe assembly including a second insulator material protruding below a lower surface of said housing and attached to said housing;

a board of a third insulator material attached to said housing above said lower surface;

a plurality of micro-coaxial segments; and
a plurality of coaxial cables,
wherein said probe assembly includes a support member of the second insulator material disposed with a plurality of probe members aligned to contact said plurality of contact locations, wherein said board includes a plurality of plated through holes corresponding to said plurality of apertures, wherein an outer conductor of each of said plurality of micro-coaxial segments is soldered within a corresponding plated through hole of said plurality of plated through holes, wherein each coaxial cable of said plurality of coaxial cables couples to a corresponding micro-coaxial segment of the plurality of micro-coaxial segments, wherein each micro-coaxial segment passes through a corresponding aperture of said plurality of apertures, wherein each micro-coaxial segment includes a first portion of center conductor exposed below said lower surface of said housing, and wherein said first portion of each micro-coaxial segment is coupled to a corresponding probe member of the plurality of probe members, and wherein said first insulator, said second insulator, said third insulator, said micro-coaxial segments, and said coaxial cables provide a low leakage pathway.

* * * * *